United States Patent
Shinomiya

(10) Patent No.: US 6,936,914 B2
(45) Date of Patent: Aug. 30, 2005

(54) INTEGRATED CIRCUIT CHIP MODULE

(75) Inventor: Kohji Shinomiya, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/395,382

(22) Filed: Mar. 25, 2003

(65) Prior Publication Data

US 2004/0065962 A1 Apr. 8, 2004

(30) Foreign Application Priority Data

Oct. 7, 2002 (JP) .................................. 2002-293915

(51) Int. Cl.⁷ ............................................ H01L 23/52
(52) U.S. Cl. ..................................... 257/691; 257/784
(58) Field of Search ................................. 257/691, 207, 257/784, 778

(56) References Cited

U.S. PATENT DOCUMENTS

| | | | |
|---|---|---|---|
| 5,387,810 A | * 2/1995 | Seta et al. | 257/370 |
| 5,434,436 A | * 7/1995 | Taniguchi et al. | 257/202 |
| 5,523,622 A | 6/1996 | Harada et al. | |
| 5,801,407 A | * 9/1998 | Yamada | 257/207 |
| 6,121,644 A | * 9/2000 | Tsujihashi et al. | 257/207 |
| 6,198,362 B1 | 3/2001 | Harada et al. | |
| 6,522,173 B1 | 2/2003 | Otsuka | |
| 6,570,206 B1 | * 5/2003 | Sakata et al. | 257/296 |
| 2002/0008597 A1 | 1/2002 | Otsuka et al. | |

FOREIGN PATENT DOCUMENTS

| | | |
|---|---|---|
| JP | 6-216272 | 8/1994 |
| JP | 8-288626 | 11/1996 |
| JP | 11-261181 | 9/1999 |
| JP | 11-284126 | 10/1999 |
| JP | 2000-20573 | 1/2000 |
| JP | 2002-26272 | 1/2002 |

OTHER PUBLICATIONS

Iizuka, Taiji; "EMC Design for Personal Information Intelligent Tool", *J. of Japan Inst. for Interconnecting and Packaging Elec. Circuit*, vol. 10, No. 4, pp. 214–216, (1995).

Otsuka, Kanji; "Supporting Role of MCM in High Density Packaging", *J. of Japan Inst. for Interconnecting and Packaging Elec. Circuit*, vol. 11, No. 5, pp. 301–305, (1996).

Paul, Clayton R.; "Introduction to Electromagnetic Compatibility", Wiley Series in Microwave and Optical Engineering, pp. 4, (1992).

* cited by examiner

*Primary Examiner*—S. V. Clark
(74) *Attorney, Agent, or Firm*—Leydig, Voit & Mayer, Ltd.

(57) ABSTRACT

On the circuit surfaces of integrated circuit chips, there are adjacently laid out a power source pad for a power source wire at a plus voltage side and a power source pad for a power source wire at a minus voltage side. On a single-surface printed wiring board, a first set of two power source wires and a second set of two power source wires respectively are flip-chip mounted to two power source pads of the integrated circuit chips. The first and second sets of the power source wires are substantially parallel to each other, with substantially constant wire widths and with a substantially constant wire interval. Near the outer periphery of the printed wiring board, the first and second sets of the power source wires are bent smoothly and follow the periphery of the printed wiring board.

20 Claims, 2 Drawing Sheets

INTEGRATED CIRCUIT CHIP MODULE

BACKGROUND OF THE INVENTION

1) Field of the Invention

The present invention relates to an integrated circuit chip module that is provided with an EMC (electromagnetic compatibility) measure, that is, EMI (electromagnetic interference) and EMS (electromagnetic susceptibility) measures.

2) Description of the Related Art

An integrated circuit chip module is structured, in many cases, as a multi-chip module that has a plurality of integrated circuit chips mounted on a printed wiring board. For example, a portable telephone has various kinds of circuits mounted within a case of a very small installation area and a very small installation capacity. These circuits include a circuit that carries out a signal processing of a voice signal, an image signal, and a data signal, a control circuit, a circuit that transmits and receives a signal by converting it into a wave, and a liquid crystal display circuit. In order to provide these circuits in light, thin and small structures, a method of mounting these circuits as a multi-chip module has been employed. The integrated circuit chip module is also used in a portable terminal, and a camera-integrated video apparatus, for the same reason of light, thin and small structures. Further, the integrated circuit chip module is also used in a computer that requires high-speed operation, and a transmitter/receiver and a measuring apparatus (a front-end circuit of a probe) that uses an ultra-high-frequency band (GHz band).

For example, when a portable telephone transmits in real time a moving picture picked up by a mounted image pick-up device, the portable telephone executes a transmission/reception of voice as well as a transmission/reception of the images obtained by the image pick-up devices while emitting a wave. At this time, the wave emitted from the portable telephone incurs an electromagnetic induction to other internal circuits mounted on this portable telephone. Therefore, this electromagnetic induction might bring about errors in the operation of these other internal circuits.

The erroneous operation includes such phenomena as an inclusion of a stripe pattern in the picked-up image, a distortion of the picked-up image, an abnormal reproduction of colors in the picked-up image, and a reduction in the signal-to-noise ratio of the picked-up image. Further, through-current noise that is intrinsic to a CMOS digital circuit generated in a digital signal processing circuit within the portable telephone may flow into an image processing circuit through a power source wire, and lower the signal-to-noise ratio of the picked-up image.

Because of the need for an EMC measure, a conventional integrated circuit chip module employs a method of mounting an integrated circuit chip on a printed wiring board that is provided with an EMC measure design as disclosed in, for example, Japanese Patent Application Laid-open No. 2000-20573 (see paragraphs 0007 to 0009 and FIG. 1), No. 2002-26272 (see paragraph 0062 and FIG. 11), and No. 6-216272 (see paragraphs 0021, 0022, and FIG. 1).

According to the conventional integrated circuit chip module, an electric field is shielded and power source impedance is lowered to minimize a change range of voltage fall due to a change in the flowing current. In order to prevent a circuit signal from flowing to other circuits through a power source circuit, there has been employed a method that patterns of power source wires at a plus voltage side and a minus voltage side (hereinafter "a set of two power source wires") formed on the printed wiring board are widened to provide plane-shape patterns. Further, there has also been employed a method that a printed wiring board is multi-layered and, and a set of two power source wires are allocated to two layers in the middle, thereby to easily realize a plane-shape power source pattern and a plane-shape ground pattern.

According to the integrated circuit chips mounted on the printed wiring board provided with the EMC measure, an electrode pad for a power source wire at a plus voltage side and a power source pad for a power source wire at a minus voltage side are not laid out adjacently in parallel. A pad having another function is disposed between the two power source pads, and the two power source pads are disposed separately at a distance. Therefore, on the printed wiring board, the respective power source wires are connected through bonding wires, and the power source wires are connected to a plane-shaped power source pattern and a plane-shaped ground pattern via respective via-holes.

However, according to the design of the conventional integrated circuit chip module, the module is designed by considering only an optimum layout within an integrated circuit chip. A layout of circuits within a chip taking an EMC measure into account, considering external parts of peripheral circuits, has not been carried Out. A package has been designed by concentrating attention on the internal structure of the package. An EMC measure has been considered at the stage of installation, and a method based only on electromagnetic shielding has been employed. For example, the surroundings of a clock circuit, which produces much radiation, and all of a circuit unit are covered with a metal plate. As a result, according to the conventional method, a large scale has been required for the EMC measure, at high cost.

In other words, at the design stage of an integrated circuit chip module, when it is possible to realize a structure in coexistence with other integrated circuit chips without causing electromagnetic interference to other integrated circuit chips and without sufficient electromagnetic interference from other integrated circuit chips, a large scale is not required to provide an electromagnetic shielding measure if necessary. Further, it is also possible to minimize cost for this measure.

SUMMARY OF THE INVENTION

It is an object of this invention to provide an integrated circuit chip module that at least solves the above-mentioned problems.

The integrated circuit chip module according to one aspect of the present invention has an integrated circuit chip that has a power source pad for a power source wire at a plus voltage side and a power source pad for a power source wire at a minus voltage side, laid out adjacently; and a printed wiring board on which a set of two power source wires that are flip-chip mounted with the two power source pads respectively are laid out substantially in parallel with each other by maintaining substantially constant wire widths and substantially constant wire interval.

The integrated circuit chip module according to another aspect of the present invention has an integrated circuit chip on which inside power source wires are laid out by being divided into a set of two power source wires for supplying power mainly to an analog circuit and a set of two power source wires for supplying power mainly to a digital circuit, and for each set of two power source wires, a power source pad for a power source wire at a plus voltage side and a power source pad for a power source wire at a minus voltage side are laid out adjacently; and a printed wiring board on which two sets of two power source wires that are flip-chip mounted with two sets of the two power source pads respectively are laid out substantially in parallel with each other, by maintaining substantially constant wire widths and substantially constant wire interval.

The integrated circuit chip module according to still another aspect of the present invention has an integrated circuit chip that has a power source pad for a power source wire at a plus voltage side and a power source pad for a power source wire at a minus voltage side, laid out adjacently for each of a plurality of required power sources; and a printed wiring board on which a plurality of sets of two power source wires that are flip-chip mounted with the two power source pads disposed for each of the power sources, are laid out substantially in parallel with each other, by maintaining substantially constant wire widths and substantially constant wire interval.

These and other objects, features and advantages of the present invention are specifically set forth in or will become apparent from the following detailed descriptions of the invention when read in conjunction with the accompanying drawings.

DETAILED DESCRIPTIONS

Exemplary embodiments of the integrated circuit chip module relating to the present invention will be explained below in detail with reference to the accompanying drawings.

Figure 1:
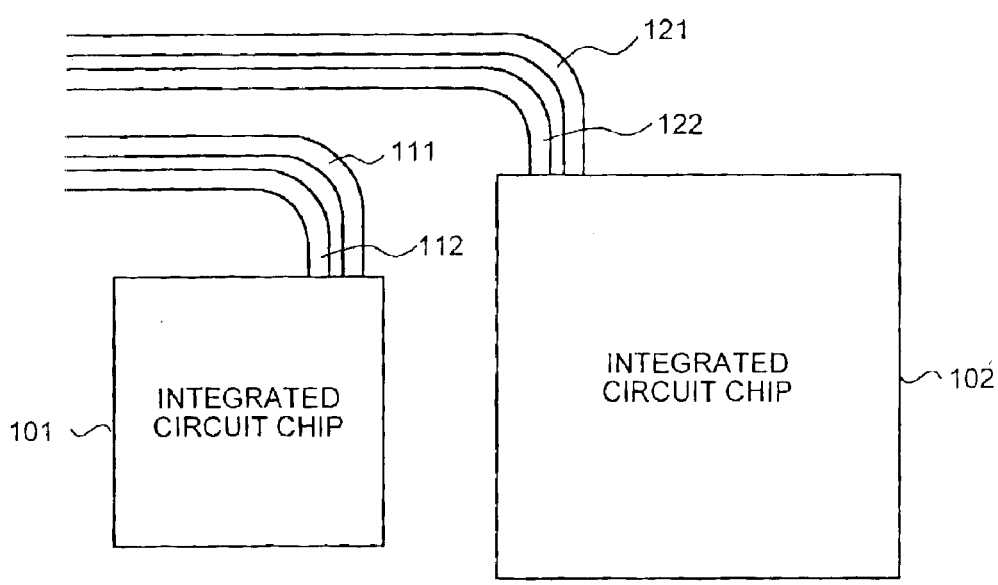
FIG. 1 is a schematic view of power source wiring on a single-surface printed wiring board that constitutes an integrated circuit chip module according to a first embodiment of the present invention.

FIG. 1 is a schematic view of a power source wiring on a single-surface printed wiring board that constitutes an integrated circuit chip module according to a first embodiment of the present invention. In FIG. 1, wires other than power source wires are not shown. FIG. 1 shows a state that two integrated circuit chips are mounted. These points are similarly applied to other embodiments to be described later.

In FIG. 1, circuit surfaces of integrated circuit chips 101 and 102 face the back side of the paper (at the side of a single-surface printed wiring board 103), and are not visible in the drawing. On these circuit surfaces, there are adjacently laid out in parallel a power source pad for a power source wire at a plus voltage side and a power source pad for a power source wire at a minus voltage side.

On the single-surface printed wiring board 103, two power source wires 111 and 112 and two power source wires 121 and 122 are flip-chip mounted with two power source pads of the integrated circuit chips 101 and 102 respectively. The respective two power source wires are formed toward the external periphery of the single-surface printed wiring board 103, substantially in parallel with each other, by maintaining substantially constant wire widths and substantially constant wire interval. The power source wires 111 and 112 and the power source wires 121 and 122 reach a portion near the external periphery of the single-surface printed wiring board 103, by maintaining a parallel state respectively. At this portion, these power source wires have smooth and mild curves, and are laid out along the external periphery of the single-surface printed wiring board 103, thereby to form independent power source lines.

A distance between the power source wires 111 and 112 and the power source wires 121 and 122 is maintained at two or more times the interval between the power source wires 111 and 112, and the interval between the power source wires 121 and 122. Further, the wire widths of the power source wires 111 and 112 and the power source wires 121 and 122 respectively are set larger than wire widths of other wires, not shown.

As explained above, according to the first embodiment, the two power source pads of each integrated circuit chip are laid out adjacently. The two sets of two power source wires are laid out substantially in parallel with each other on the printed wiring board that is flip-chip mounted with the two power source pads respectively. The two sets of two power source wires have substantially constant widths respectively, and have substantially constant intervals between the wires respectively. Further, these power source wires are laid out along the external periphery of the printed wiring board.

As a result, the wiring of the two sets of two power source wires is considered as a distributed constant circuit. Further, characteristic impedance can be set as substantially a constant low value. Therefore, it is possible to transmit a signal by dividing it into a differential signal and an in-phase signal. As a result, it is possible to efficiently lead a supplied power source voltage and a power source current to an integrated circuit chip that is a load, as power of a differential component.

Even when a transmission wave of a compact portable apparatus such as a portable telephone and a higher harmonic wave of an operation signal of a digital circuit are electromagnetically induced to induce a voltage to the set of two power source wires, the voltage becomes an in-phase voltage. This in-phase voltage gives uniform voltages to the two conductive wires of the set of two power source wires. Therefore, it is not possible to flow a current due to the block by high impedance. In other words, it is possible to block the electromagnetic induction from the integrated circuit chip to the set of two power source wires on the printed board.

It is possible to directly connect a wire other than the power source wires between the integrated circuit chips mounted on the printed wiring board, based on printed wiring on the same surface. Therefore, it is possible to reduce the length of this wire. Consequently, it is possible to minimize an electromagnetic wave radiated from this wire. As it is also possible to reduce the electromagnetic wave that is received by this wire, it becomes possible to realize an integrated circuit chip module that receives little interference.

As each set of two power source wires is laid out with an extremely small interval between the two power source wires, it is possible to sufficiently reduce the impedance of the set of two power source wires. Further, the distance from a set of two power source wires to the other set of two power source wires laid out adjacently is larger than the distance between the wires of each set of two power source wires, by at least two times this interval. Therefore, it is possible to make the coupling sufficiently small, and it is possible to handle the two sets as electrically independent two sets of two power source wires. As a result, it is possible to facilitate the wiring design of the power source wires.

As the wire width of each power source wire of the sets of two power source wires is larger than the wire widths of other wires, it is possible to lower the resistance of the power source wire itself. At the same time, it is possible to improve the operation frequency characteristic of the distributed constant circuit of the transmission line based on the sets of two power source wires. Therefore, it is possible to realize an integrated circuit chip module that is provided with an EMC measure against a higher frequency.

As the curved portion of each set of two power source wires is formed to draw a mild arc in a smooth curve, it is possible to minimize a change of wiring impedance at the curved portion of the printed wiring. In other words, it is possible to minimize reflection or radiation of an electromagnetic wave from the curved portion. Therefore, it is possible to minimize dynamic noise, and reinforce noise resistance. As a result, it is possible to realize an integrated circuit chip module with stabilized operation.

According to the currently available technique of manufacturing an integrated circuit chip module, it is considered possible to obtain an integrated circuit chip module in which an interval of 0.1 millimeter per line and space is characteristically and economically satisfactory. On the other hand, it is difficult to arrange wiring of power source wires by keeping completely constant intrinsic impedance of a power source without variation.

In the first embodiment, the wire interval is set to not larger than 0.1 millimeter in the sets of two power source wires, and the wire interval maintains substantially a constant distance of not larger than 0.1 millimeter over the whole length. Therefore, it is possible to set the impedance of the sets of two power source wires to a sufficiently low value of not larger than 50 Ω. As a result, it is possible to realize an integrated circuit chip module that is provided with an EMC measure of a larger effect.

Figure 2:
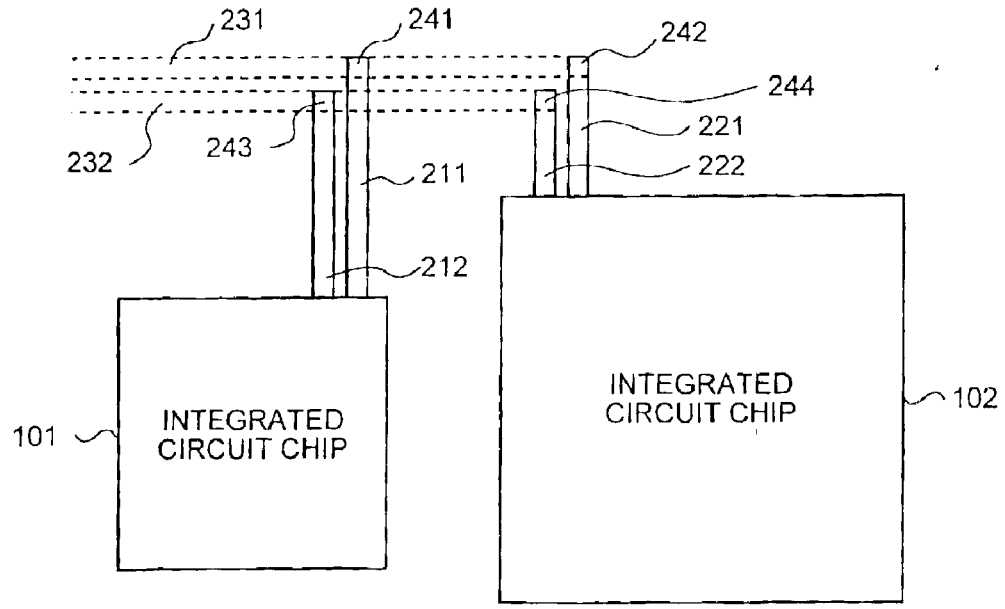
FIG. 2 is a schematic view of power source wiring on both surfaces of a printed wiring board that constitutes an integrated circuit chip module according to a second embodiment of the present invention.

FIG. 2 is a schematic view of a power source wiring on a both-surface printed wiring board that constitutes an integrated circuit chip module according to a second embodiment of the present invention. In FIG. 2, constituent elements that are the same as or equivalent to those shown in FIG. 1 are attached with the same reference numbers. Portions that differ from the first embodiment and that are characteristic features of the second embodiment will be mainly explained below.

In FIG. 2, on the front surface of a both-surface printed wiring board 203, power source wires 211 and 212 and power source wires 221 and 222 are flip-chip mounted with two power source pads of integrated circuit chips 101 and 102 respectively. The respective power source wires are formed toward the external periphery of the both-surface printed wiring board 203, substantially in parallel with each other, by maintaining substantially constant wire widths and substantially constant wire interval.

On the rear surface of the both-surface printed wiring board 203, two power source wires 231 and 232 are laid out by maintaining substantially constant wire widths and substantially constant wire interval, substantially in parallel with each other. Via-holes 241, 242, 243, and 244 are formed at positions where the power source wires 231 and 232 on the rear surface cross with the power source wires 211 and 212 and the power source wires 221 and 222 on the front surface respectively. Diameters of the via-holes 241, 242, 243, and 244 are set substantially the same as or smaller than the wire widths of the power source wires respectively.

In other words, the power source wire 211 on the integrated circuit chip 101 is connected to the power source wire 231 on the rear surface via the via-hole 241, and the power source wire 221 on the integrated circuit chip 102 is connected to this power source wire 231 via the via-hole 242. The other power source wire 212 on the integrated circuit chip 101 is connected to the other power source wire 232 on the rear surface via the via-hole 243, and the other power source wire 222 on the integrated circuit chip 102 is connected to this power source wire 232 via the via-hole 244.

As explained above, according to the second embodiment, a plurality of sets of two power source wires disposed on the front surface of the printed wiring board are connected in parallel and combined together with a set of two power source wires formed on the rear surface of the printed wiring board via via-hole wires. Therefore, the four power source wires can be combined together to two in the example shown in FIG. 2. Therefore, it is possible to reduce the area of the printed wiring board, and it is also possible to reduce the number of connection of power source wires to external connection terminals. Consequently, it is possible to make the printed wiring board compact, and it is possible to increase reliability of the connection. As a result, it is possible to provide an integrated circuit chip module at low cost.

As the diameter of each via-hole at the wiring portion is set substantially the same as or smaller than the wire width of each power source wire on the printed wiring board, it is possible to minimize a change in the wiring impedance at the via-hole portion. Consequently, it is possible to minimize reflection or radiation of an electromagnetic wave from the via-hole portion. Therefore, it is possible to minimize dynamic noise, and reinforce noise resistance. As a result, it is possible to realize an integrated circuit chip module with stabilized operation.

Figure 3:
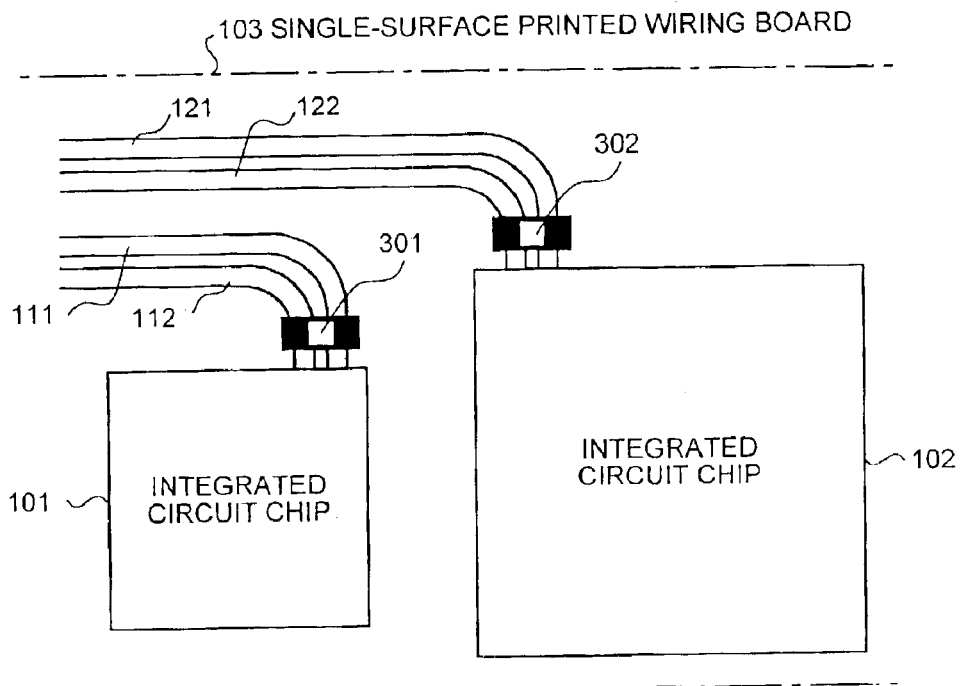
FIG. 3 is a schematic view of power source wiring on a single-surface printed wiring board that constitutes an integrated circuit chip module according to a third embodiment of the present invention.

FIG. 3 is a schematic view of a power source wiring on a single-surface printed wiring board that constitutes an integrated circuit chip module according to a third embodiment of the present invention. In FIG. 3, constituent elements that are the same as or equivalent to those shown in FIG. 1 are attached with the same reference numbers. Portions that differ from the first embodiment and the second embodiment and that are characteristic features of the third embodiment will be mainly explained below.

According to the third embodiment shown in FIG. 3, in the structure shown in FIG. 1, a capacitor 301 is insertion connected to between the set of two power source wires 111 and 112 on the single-surface printed wiring board 103, at a position extremely near (for example, within 3 millimeters) the connection point between the two power source pads of the integrated circuit chip 101 and the power source wires 111 and 112 on the single-surface printed wiring board 103.

A capacitor 302 is insertion connected to between the set of two power source wires 121 and 122 on the single-surface printed wiring board 103, at a position extremely near (for example, within 3 millimeters) the connection point between the two power source pads of the integrated circuit chip 102 and the set of power source wires 121 and 122 on the single-surface printed wiring board 103.

As explained above, according to the third embodiment, a capacitor is insertion connected to between the set of two power source wires on the printed wiring board, at a position extremely near the connection point between the two power source pads of the integrated circuit chip and the set of power source wires on the printed wiring board. Therefore, it is possible to lower the impedance of the power source terminal of the integrated circuit chip. At the same time, it is possible to remove high-frequency noise generated in the integrated circuit chip or high-frequency noise entering via the set of two power source wires, by bypassing the noise. As a result, it is possible to realize an integrated circuit chip module that is provided with an EMC measure of a larger effect.

Figure 4:
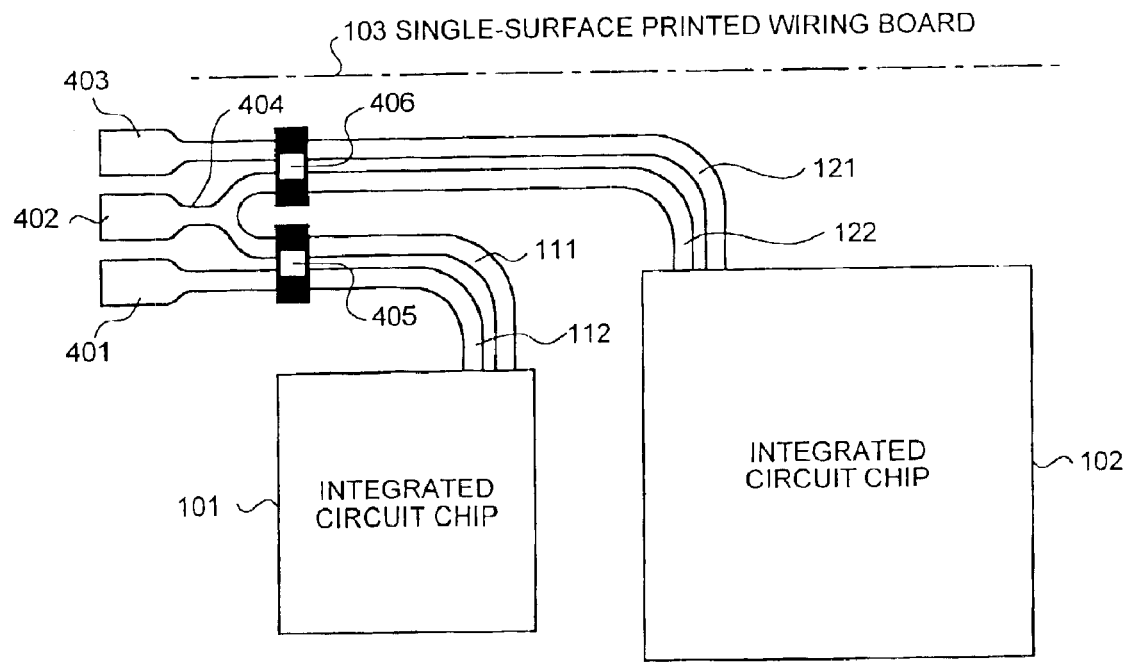
FIG. 4 is a schematic view of a power source wiring on a single-surface printed wiring board that constitutes an integrated circuit chip module according to a fourth embodiment of the present invention.

FIG. 4 is a schematic view of a power source wiring on a single-surface printed wiring board that constitutes an integrated circuit chip module according to a fourth embodiment of the present invention. In FIG. 4, constituent elements that are the same as or equivalent to those shown in FIG. 1 are attached with the same reference numbers. Portions that differ from the first to third embodiments and that are characteristic features of the fourth embodiment will be mainly explained below.

According to the fourth embodiment shown in FIG. 4, in the structure shown in FIG. 1, three external connection terminals 401, 402, and 403 are provided for the four power source wires 111, 112, 121, and 122 that are laid out in parallel along the external periphery of the single-surface printed wiring board 103.

Of the four power source wires 111, 112, 121, and 122, the outside power source wires 112 and 121 are connected to the external connection terminals 401 and 403 respectively. On the other hand, the inside power source wires 111 and 122 are combined together near the external connection terminal 402, and this combined portion is connected to the external connection terminal 402.

A capacitor 405 is insertion connected to between the set of two power source wires 111 and 112, and a capacitor 406 is insertion connected to between the set of two power source wires 121 and 122, on the single-surface printed wiring board 103, at a position extremely near (for example, within 5 millimeters) a portion 404 of combining the power source wires 111 and 122.

The inside power source wires 111 and 122 may be independently connected to external connection terminals provided on the single-surface printed wiring board 103, without being combined together. In this case, the capacitor 405 is insertion connected to between the set of two power source wires 111 and 112, and the capacitor 406 is insertion connected to between the set of two power source wires 121 and 122, on the single-surface printed wiring board 103, at a position extremely near (for example, within 5 millimeters) the external connection terminals.

As explained above, according to the fourth embodiment, two sets of two power source wires are laid out in parallel. Of the four power source wires in total, the outside two power source wires are connected respectively to two external connection terminals independently provided on the printed wiring board. The inside two power source wires are combined together near a third external connection terminal provided on the printed wiring board, and the combined portion is connected to this third external connection terminal. Therefore, it is possible to reduce the number of the external connection terminals by one. Consequently, it is also possible to reduce the area of the printed wiring board, and it is possible to make the printed wiring board compact.

As a result, it is possible to increase the reliability of the connection, and it is possible to provide an integrated circuit chip module at low cost.

Capacitors are insertion connected to between each of the sets of two power source wires at a position of within 5 millimeters, extremely near from the joining and connection portion of the inside two power source wires out of the four in total at the external connection terminal portion provided on the printed wiring board. Therefore, it is possible to lower the impedance at the portion of combining the wires together, and it is also possible to reduce variation.

In addition, it is possible to remove high-frequency noise entering via the external connection terminals or high-frequency noise entering via the set of two power source wires, by bypassing the noise. As a result, it is possible to realize an integrated circuit chip module that is provided with an EMC measure of a larger effect.

When the two sets of two power source wires are laid out in parallel, and the four power source wires are connected respectively to external connection terminals independently provided on the printed wiring board, capacitors are insertion connected to between the two power source wires of each set, at a portion extremely near these external connection terminals. Therefore, it is possible to lower the impedance of the external connection terminals. At the same time, it is possible to remove high-frequency noise entering via the external connection terminals or high-frequency noise entering via the power source wires, by bypassing the noise. As a result, it is also possible to realize an integrated circuit chip module that is provided with an EMC measure of a larger effect.

In an integrated circuit chip module as a fifth embodiment of the present invention, modifications of the above embodiments or various modes generated from the embodiments are shown.

(1) In the first to fourth embodiments (FIG. 1 to FIG. 4), each integrated circuit chip has two power source pads laid out in parallel adjacently. However, a plurality of power sources are required in many cases in a multifunction integrated circuit chip. Various kinds of modes can be considered for this. The following three cases will be explained below: (a) an analog circuit and a digital circuit are mounted together, (b) required power source voltages are different, and (c) circuits of different noise characteristics are mounted together, such as a circuit that generates noise and a circuit that can easily receive the influence of noise.

(a) When an analog circuit and a digital circuit are mounted together:

In general, a digital circuit can take a large noise margin, but an analog circuit has a small noise margin. A digital circuit has a structure that, when a CMOS is used, much power is used when threshold values of "1" and "0" are exceeded. Therefore, when power source wires are common to those of an analog circuit, a change in power source current based on the operation of the digital circuit affects the analog circuit via the power source wires, and deteriorates the analog signal. Therefore, it is necessary to separate a power source of the analog circuit from a power source of the digital circuit.

However, there are some circuits in which the power source of an analog circuit cannot be separated from the power source of a digital circuit. For example, these circuits are an ADC (analog-to-digital converter), a DAC (digital-to-analog converter), a DCDC converter, a comparator, a charge-pump circuit (step-up circuit), and a memory reading circuit. On the other hand, a digital circuit that is operated at a very low occasion may share a power source with an analog circuit without causing any problem. When the power source of the analog circuit is separated from the power source of the digital circuit, it is necessary to take the above into account.

In the integrated circuit chip on which an analog circuit and a digital circuit are mounted together, inside power source wires are laid out by being divided into a set of two power source wires for supplying power mainly to the analog circuit and a set of two power source wires for supplying power mainly to the digital circuit. For each set of two power source wires, a power source pad for a power source wire at a plus voltage side and a power source pad for a power source wire at a minus voltage side are laid out adjacently.

For the sets of two power source wires formed on the printed wiring board, the structure is as explained in the first embodiment. In other words, the two sets of two power source wires are flip-chip mounted with two power source pads of the integrated circuit chips. The respective sets of two power source wires are formed substantially in parallel with each other, by maintaining substantially constant wire widths and substantially constant wire interval. The second to fourth embodiments are based on this structure.

According to this structure, it is possible to reduce a phenomenon that a current change due to a through-current generated from a CMOS switching circuit of a digital circuit that constitutes the integrated circuit chip becomes power source voltage variation noise via the power source circuit of an analog circuit. Therefore, it is possible to supply a constant voltage to the analog circuit without noise. Consequently, it is possible to stabilize the operation of the analog circuit, and it is possible to obtain an analog output with little noise. As a result, it is possible to realize a high-performance integrated circuit chip module with little dynamic noise.

(b) When required power source voltages are different, basically, on an integrated circuit chip, a power source pad for a power source wire at a plus voltage side and a power source pad for a power source wire at a minus voltage side are laid out adjacently for each of a plurality of required power sources.

For the sets of two power source wires formed on the printed wiring board, the structure is as explained in the first embodiment. In other words, the sets of two power source wires are flip-chip mounted with two power source pads of the integrated circuit chips, for each of the power sources. Each of a plurality of sets of two power source wires are formed substantially in parallel with each other, by maintaining substantially constant wire widths and substantially constant wire interval. The second to fourth embodiments are based on this structure.

(c) When there are a group of circuits that generate noise and a group of circuits that can easily receive the influence of noise at the same voltage, a power source pad for a power source wire at a plus voltage side and a power source pad for a power source wire at a minus voltage side are laid out adjacently, for each independent circuit group.

In this case, however, it is necessary that the two power source pads for each circuit group are provided such that the current flowing through the power source at the plus voltage side and the current flowing through the power source at the minus voltage side are set substantially the same value in a dynamic operating state of the circuit group. In other words, the two power source pads for each circuit group are set such that a differential current flows.

For the sets of two power source wires formed on the printed wiring board, the structure is as explained in the first embodiment. In other words, the sets of two power source wires are flip-chip mounted with two power source pads of the integrated circuit chips, for each of the power sources. Each of a plurality of sets of two power source wires are formed substantially in parallel with each other, by maintaining substantially constant wire widths and substantially constant wire interval. The second to fourth embodiments are based on this structure.

(d) As explained above, in designing the integrated circuit chip, it is necessary to use a specification that matches the wiring of the printed wires on the printed wiring board, and design power source wires that are drawn to the outside of the integrated circuit chip by taking into account the processing that facilitates an EMC measure.

Based on this, it is possible to realize the wiring of power source wires on the printed wiring board as a distributed constant circuit of a transmission line. It is also possible to set the characteristic impedance to substantially a constant low value. Therefore, it is possible to transmit a signal by dividing it into a differential signal and an in-phase signal.

(2) According to the via-hole wiring shown in the second embodiment (FIG. 2), the diameters of the via-holes are set substantially the same as or smaller than the wire widths of the power source wires respectively. The intrinsic impedance of the via-hole wiring is set close to the intrinsic impedance according to the printed wiring. However, it is difficult to realize the intrinsic impedance that is the same as the intrinsic impedance according to the printed wiring. Reflection or radiation occurs due to the variation in the intrinsic impedance that occurs in the via-holes.

In FIG. 2, a capacitor is insertion connected to between power source wires that are connected in parallel via a via-hole wires, at a position extremely near (for example, within 5 millimeters) a combining portion of the power source wires. Based on this, reflection or radiation is removed by bypassing. With this arrangement, there is no influence to the integrated circuit chips 101 and 102 and external connection terminals to which the set of two power source wires 231 and 232 on the rear surface are connected.

Specifically, a capacitor is inserted into the via-holes 241 and 243 at which the set of two power source wires 211 and 212 are connected to the set of two power source wires 231 and 232 respectively, at either one side or both sides of the integrated circuit chip 101 and the external connection terminal. Further, a capacitor is inserted into the via-holes 242 and 244 at which the set of two power source wires 221 and 222 are connected to the set of two power source wires 231 and 232 respectively, at either one side or both sides of the integrated circuit chip 102 and the-external connection terminal.

Based on this, it is possible to lower the impedance at the wire combining portion and the via-hole portion, and it is also possible to minimize variation. At the same time, it is possible to remove high-frequency noise entering via the external connection terminals or high-frequency noise entering via the set of two power source wires, by bypassing the noise. As a result, it is possible to realize an integrated circuit chip module that is provided with an EMC measure of a larger effect.

(3) It is possible to structure the single-surface printed wiring board shown in the first, third and fourth embodiments and the both-surface printed wiring board shown in the second embodiment, with a flexible printed wiring board respectively.

According to this structure, it is possible to provide a structure that also functions as a connection wire between printed wiring boards. It is possible to optionally change a shape of fitting the printed wiring board. Therefore, it is possible to fit the printed wiring board by absorbing a size tolerance of the fitting portion. As it is possible to structure a flexible printed wiring board by bending the printed wiring board, it is possible to mount integrated circuit chips in superimposition and in compact. Further, it is possible to structure a flexible printed wiring board by fixing it by adhesion in a bent state. Therefore, it is possible to install an integrated circuit chip module in compact easily and stably.

(4) The external connection terminal shown in the fourth embodiment is formed on a flexible printed wiring board in a shape drawn in convex. There are the following two modes of external connection terminals having a shape drawn in convex.

A first mode is that an end portion of a flexible printed wiring board is cut out in convex, and an electrode pattern is formed on this portion protruded in convex. A shape of the electrode pattern is, for example, a long rectangle having line and space of 0.5 millimeter on a single surface of a flexible printed wiring board, with a length of 3 millimeters. An electrode portion is provided with metal plating for rust prevention. A reinforcing plate is adhered to the rear surface of the printed wiring board to make it hard. This portion is inserted into a connector for fixing. The portion fitted to the connector is extended by 2 to 5 centimeters from a module main body for use.

A second mode is that male and female connectors are used for fixing. The connectors are extended by 2 to 5 centimeters from a module main body for use. The connectors are fitted to the flexible printed wiring board with a solder. By engaging the connectors with the printed wiring board, electrical connection is provided.

According to the above structure, the external connection terminal formed by drawing it onto the flexible printed wiring board also functions as a connection wire between printed wiring boards. Therefore, it becomes easy to carry out a connection work. Further, as it is possible to omit a connection cable for connecting between integrated circuit chip modules, it is possible to reduce the number of parts required. As a result, it is possible to realize an integrated circuit chip module that is provided with an EMC measure at low cost.

As explained above, according to the present invention, two power source pads of each integrated circuit chip are laid out adjacently. Sets of two power source wires are laid out substantially in parallel with each other on the printed wiring board that is flip-chip mounted with the two power source pads respectively. The sets of two power source wires have substantially constant widths respectively, and have substantially constant intervals between the wires respectively. Therefore, the wiring of the sets of two power source wires is considered as a distributed constant circuit. Further, characteristic impedance can be set as substantially a constant low value. Therefore, it is possible to transmit a signal by dividing it into a differential signal and an in-phase signal. As a result, it is possible to efficiently lead a supplied power source voltage and a power source current to an integrated circuit chip that is a load, as power of a differential component, and it is possible to increase EMC noise resistance and increase stability of operation.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An integrated circuit chip module comprising:
   a first integrated circuit chip including a first power source pad for a plus voltage and a second power source pad for a minus voltage, the first and second power source pads being adjacent to each other; and
   a printed wiring board including a first power source wire and a second power source wire substantially to each other parallel, wherein
      the first power source wire has a substantially constant width and contacts the first power source pad,
      the second power source wire has a substantially constant width and contacts the second power source pad, and
      the first and second power source wires are separated from each other by a substantially constant interval.

2. The integrated circuit chip module according to claim 1, wherein the first and second power source wires are located along an outer periphery of the printed wiring board.

3. The integrated circuit chip module according to claim 1, wherein each of the first and second power source wires includes a curved portion.

4. The integrated circuit chip module according to claim 1, wherein the width on each of the first and second power source wires is larger than wire widths of other wires of the printed wiring board.

5. The integrated circuit chip module according to claim 1, wherein the distance between the first and second power source wires is not larger than 0.1 millimeter.

6. The integrated circuit chip module according to claim 1, wherein the printed wiring board includes:
   a first via-hole having a diameter not larger than the width of the first power source wire and through which the first power source wire is led from a front surface of the printed wiring board to a rear surface of the printed wiring board, and
   a second via-hole having a diameter not larger than the width of the second power source wire and through which the second power source wire is led from the front surface to the rear surface.

7. The integrated circuit chip module according to claim 1, further comprising a capacitor connected between the first and second power source wires at a position within 3 millimeters of the first and second power source pads.

8. The integrated circuit chip module according to claim 1, wherein the printed wiring board includes an external terminal and a capacitor connected between the first and second power source wires at a position within 5 millimeters of the external terminal.

9. The integrated circuit chip module according to claim 1, wherein
   the first integrated circuit chip further includes a third power source pad for a plus voltage and a fourth power source pad for a minus voltage,
   the third and fourth power source pads are adjacent to each other,
   the printed wiring board further includes a third power source wire and a fourth power source wire substantially parallel to each other,
   the third power source wire has a substantially constant width and contacts the third power source pad,
   the fourth power source wire has a substantially constant width and contacts the fourth power source pad, and
   the third and fourth power source wires are separated from each other by a substantially constant interval.

10. The integrated circuit chip module according to claim 9, wherein the first integrated circuit chip includes an analog circuit and a digital circuit, the first and second power source pads being connected to the analog circuit and the third and fourth power source pads being connected to the digital circuit.

11. The integrated circuit chip module according to claim 9, wherein the first and second power source wires are connected to a first power source and the third and fourth power source wires are connected to a second power source.

12. The integrated circuit chip module according to claim 11, wherein
the first integrated circuit chip includes a first circuit and a second circuit,
the first and second power source pads are connected to the first circuit,
the third and fourth power source pads are connected to the second circuit, and
current flowing through the first power source wire and current flowing through the second power source wire are substantially the same in a dynamic operating state.

13. The integrated circuit chip module according to claim 9, wherein
the printed wiring board includes a first external terminal, a second external terminal, and a third external terminal,
the first power source wire is connected to the first external terminal,
the third power source wire is connected to the third external terminal, and
the second and fourth source wires are between the first and third power source wires and connected to the second external terminal.

14. The integrated circuit chip module according to claim 9, wherein distance between a set including the first and second power source wires and a set including the third and fourth power source wires is at least twice the interval between the first and second power source wires.

15. The integrated circuit chip module according to claim 1, further comprising a second integrated circuit chip that includes a third power source pad for a plus voltage and a fourth power source pad for a minus voltage, the third and fourth power source pads being adjacent to each other,
the printed wiring board further includes a third power source wire and a fourth power source wire substantially parallel to each other,
the third power source wire has a substantially constant width and contacts the third power source pad,
the fourth power source wire has a substantially constant width and contacts the fourth power source pad, and
the third and fourth power source wires are separated from each other by a substantially constant interval.

16. The integrated circuit chip module according to claim 15, wherein the first and second power source wires are connected to a first power source, and the third and fourth power source wires are connected to a second power source.

17. The integrated circuit chip module according to claim 16, wherein
the first integrated circuit chip includes a first circuit and a second circuit,
the first and second power source pads being connected to the first circuit,
the third and fourth power source pads are connected to the second circuit, and
current flowing through the first power source wire and current flowing through the second power source wire are substantially the same in a dynamic operating state.

18. The integrated circuit chip module according to claim 15, wherein
the printed wiring board includes a first external terminal, a second external terminal, and a third external terminal,
the first power source wire is connected to the first external terminal,
the third power source wire is connected to the third external terminal, and
the second and fourth source wires are between the first and third power source wires and connected to the second external terminal.

19. The integrated circuit chip module according to claim 15, wherein a distance between a set including the first and second power source wires and a set including the third and fourth power source wires is at least twice the interval between the first and second power source wires.

20. The integrated circuit chip module according to claim 1, wherein the printed wiring board is a flexible printed wiring board.

* * * * *

UNITED STATES PATENT AND TRADEMARK OFFICE
CERTIFICATE OF CORRECTION

PATENT NO. : 6,936,914 B2
APPLICATION NO. : 10/395382
DATED : August 30, 2005
INVENTOR(S) : Shinomiya et al.

It is certified that error appears in the above-identified patent and that said Letters Patent is hereby corrected as shown below:

Replace claims 1-20 with the following:

1. An integrated circuit chip module comprising:
    a first integrated circuit chip including a first power source pad for a first power voltage and a second power source pad for a second power voltage, the first and second power source pads being adjacent to each other, and the first power voltage being higher than the second power voltage;
    a second integrated circuit chip including a third power source pad for the first power voltage and a fourth power source pad for the second power voltage, the third and fourth power source pads being adjacent to each other; and
    a wiring board including a first power source wire electrically connected to the first power source pad, a second power source wire electrically connected to the second power source pad, a third power source wire electrically connected to the third power source pad, and a fourth power source wire electrically connected to the fourth power source pad, wherein
        the first and second power source wires are separated by a first distance shorter than separations between either of the first and second power source wires and either of the third and fourth power source wires, and
        the third and fourth power source wires are separated by a second distance shorter than the separations between either of the first and second power source wires and either of the third and fourth power source wires.

2. The integrated circuit chip module according to claim 1, wherein a third distance between a set including the first and second power source wires and a set including the third and fourth power source wires is at least twice the first distance.

3. The integrated circuit chip module according to claim 1, wherein the wiring board is a flexible wiring board.

UNITED STATES PATENT AND TRADEMARK OFFICE
CERTIFICATE OF CORRECTION

| | | |
|---|---|---|
| PATENT NO. | : 6,936,914 B2 | |
| APPLICATION NO. | : 10/395382 | |
| DATED | : August 30, 2005 | |
| INVENTOR(S) | : Shinomiya et al. | |

It is certified that error appears in the above-identified patent and that said Letters Patent is hereby corrected as shown below:

4. The integrated circuit chip module according to claim 1, wherein the first integrated circuit chip and the second integrated circuit chip are flip-chip mounted on the wiring board.

Signed and Sealed this

Twelfth Day of December, 2006

JON W. DUDAS
*Director of the United States Patent and Trademark Office*